(12) United States Patent
Miyata et al.

(10) Patent No.: US 7,430,344 B2
(45) Date of Patent: Sep. 30, 2008

(54) ACOUSTO-OPTIC DEVICE AND FABRICATION METHOD OF ACOUSTO-OPTIC DEVICE

(75) Inventors: Hiroshi Miyata, Kawasaki (JP); Yukito Tsunoda, Kawasaki (JP); Tadao Nakazawa, Kawasaki (JP); Yumi Nakazawa, Zama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/723,936

(22) Filed: Mar. 22, 2007

(65) Prior Publication Data

US 2007/0189655 A1    Aug. 16, 2007

Related U.S. Application Data

(62) Division of application No. 10/945,923, filed on Sep. 22, 2004, now Pat. No. 7,218,797.

(30) Foreign Application Priority Data

May 21, 2004   (JP)   ............................ 2004-152512

(51) Int. Cl.
   *G02F 1/295* (2006.01)
(52) U.S. Cl. .................. 385/4; 385/7; 385/11
(58) Field of Classification Search ............... 385/4, 385/7, 11, 14
   See application file for complete search history.

(56) References Cited

U.S. PATENT DOCUMENTS

| 5,621,839 | A | 4/1997 | Asano et al. | 385/129 |
| 6,233,372 | B1 | 5/2001 | Nakaya | 385/11 |
| 6,720,845 | B2 | 4/2004 | Takahashi et al. | 333/193 |
| 6,754,403 | B1 | 6/2004 | Schmid | 385/7 |
| 2004/0245891 | A1 | 12/2004 | Kawachi et al. | 310/313 |

FOREIGN PATENT DOCUMENTS

| JP | HE1 8-54589 | 2/1996 |
| JP | 2002-542511 | 12/2002 |

OTHER PUBLICATIONS

U.S. Appl. No. 10/945,923, filed Sep. 22, 2004, Hiroshi Miyata, Fujitsu Limited, Kawasaki, Japan.

*Primary Examiner*—Hemang Sanghavi
(74) *Attorney, Agent, or Firm*—Staas & Halsey LLP

(57) ABSTRACT

An acousto-optic device is disclosed which can achieve both of suppression of secular change and prevention of device damage and can maintain a stabilized wavelength selection filtering operation. The acousto-optic device includes a substrate on which a SAW guide for guiding a surface acoustic wave and an optical waveguide for guiding an optical wave are provided. A pyro-electricity coping conductive wiring pattern is provided in a region of the substrate other than the SAW guide and neutralizes polarization charge generated on a surface of the substrate.

10 Claims, 17 Drawing Sheets

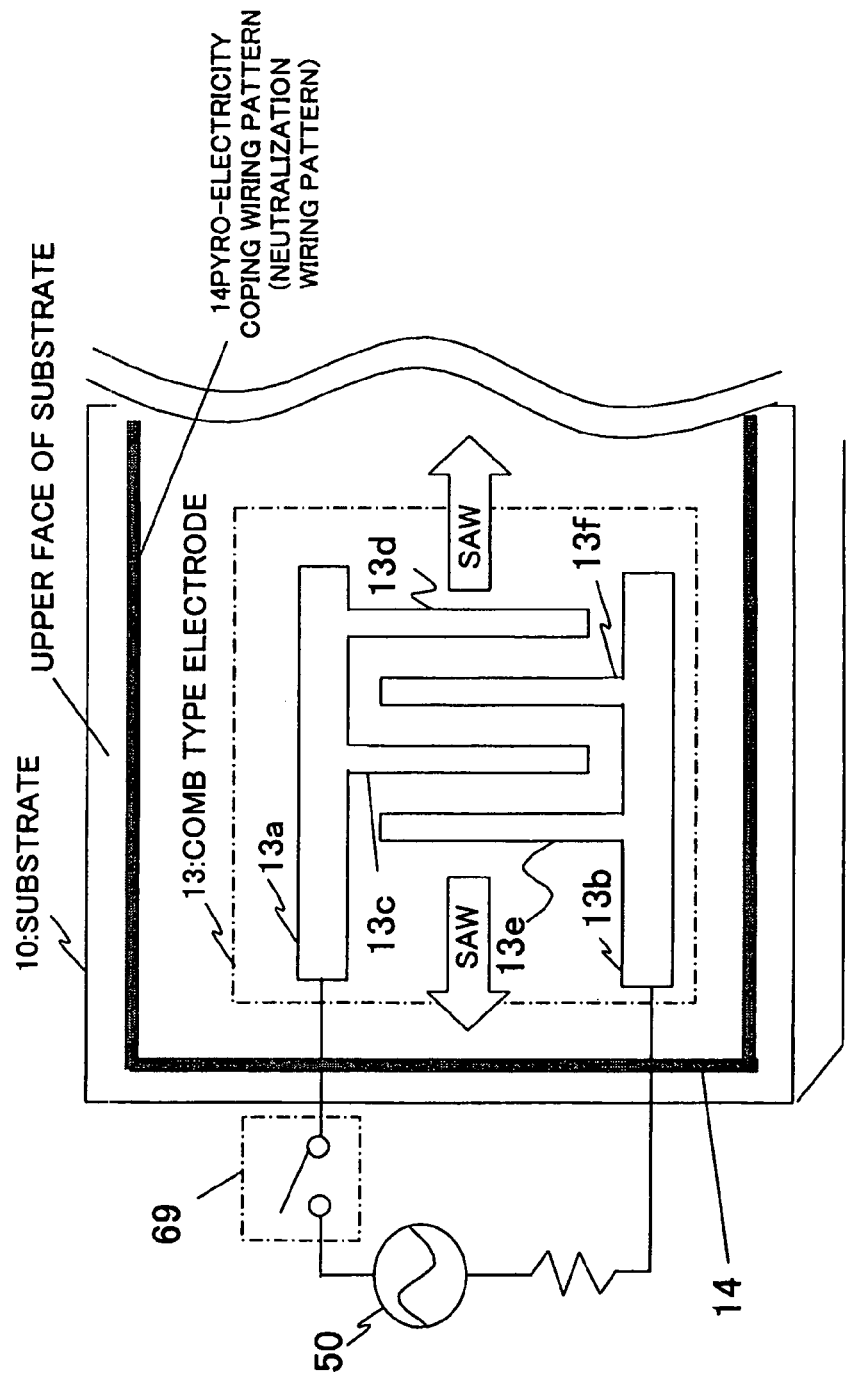

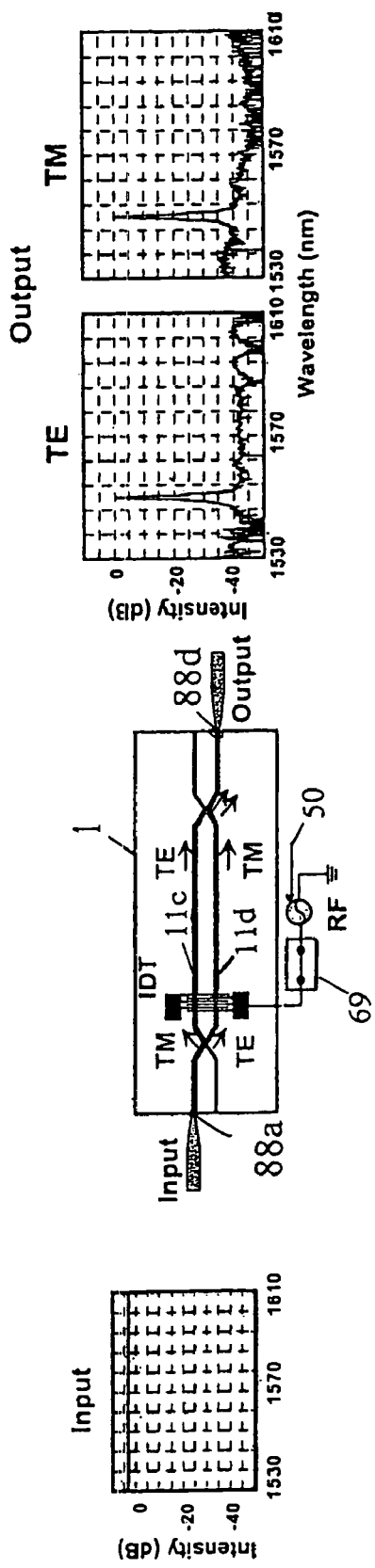
FIG. 4A SELECTED (RF ON)
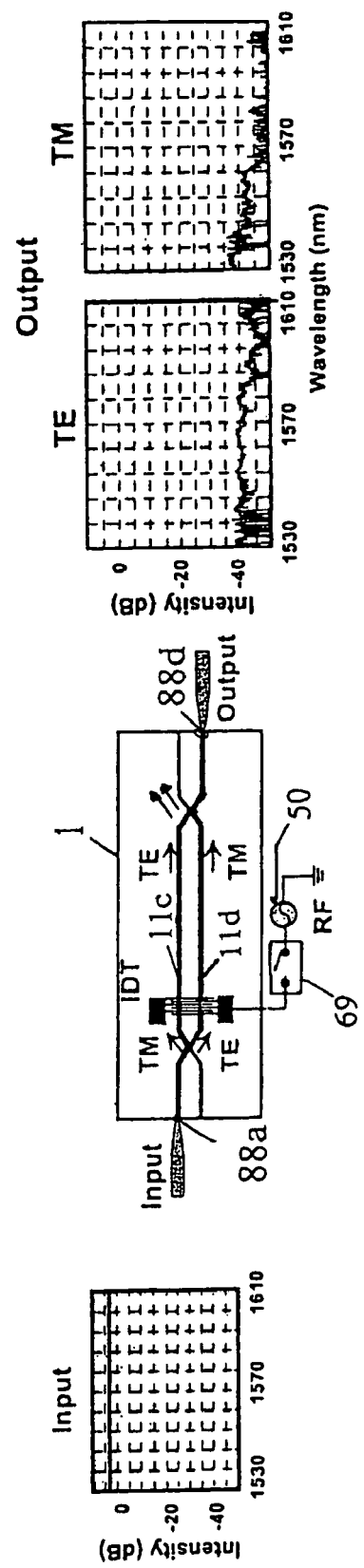
FIG. 4B SELECTED (RF OFF)

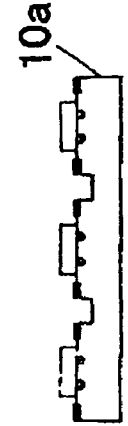
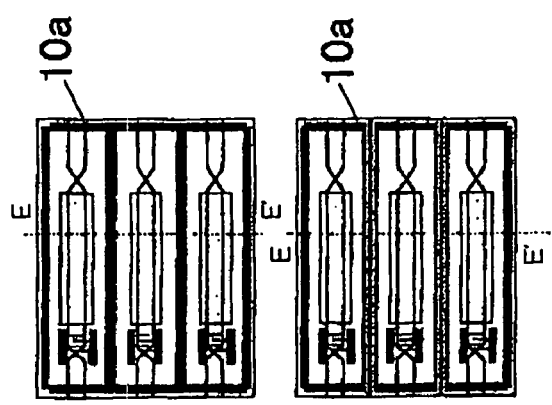
FABRICATION STEPS OF GROOVES (PART 2)
FIG. 9A AU VAPOR DEPOSITION IDT/ PYRO-ELECTRICITY COPING PATTERNING
FIG. 9B GROOVE FORMATION (CUTTING SAW OR ETCHING)
FIG. 9C
FIG. 9D

A-A' SECTION

WIRING LINES ARE EXTENDED UP TO SIDE FACE

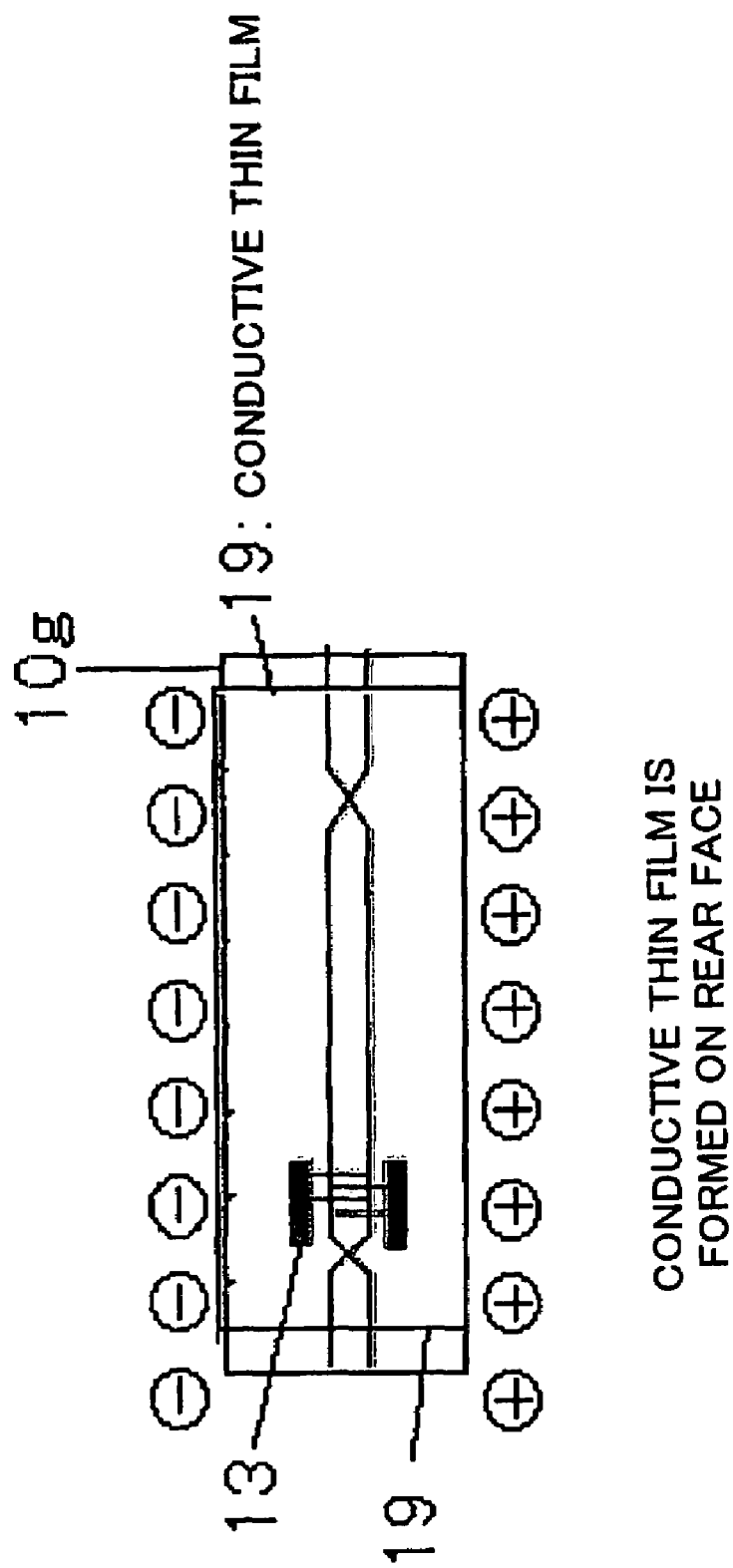

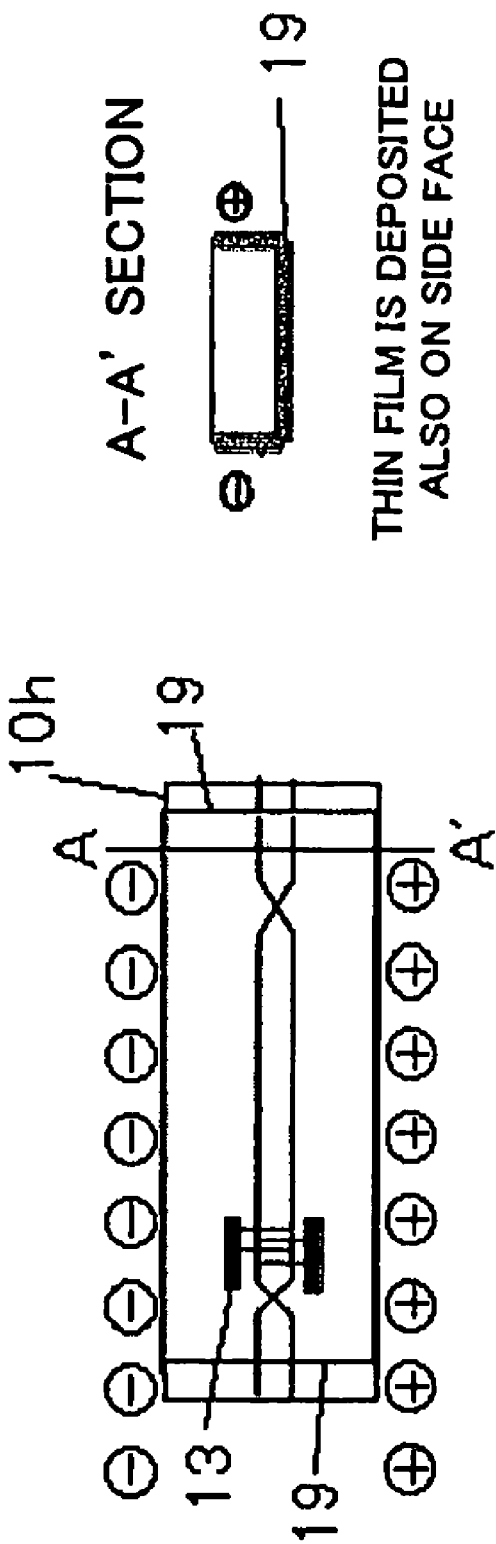

ACOUSTO-OPTIC DEVICE AND FABRICATION METHOD OF ACOUSTO-OPTIC DEVICE

CROSS REFERENCE TO RELATED APPLICATION

This application is a Divisional of application Ser. No. 10/945,923 filed Sep. 22, 2004, now U.S. Pat. No. 7,218,797 which is incorporated herein by reference in its entirety.

BACKGROUND OF THE INVENTION

1. Field of the Invention

The present invention relates typically to an acousto-optic device and a fabrication method of an acousto-optic device, and more particularly to an acousto-optic device suitable for use with an acousto-optic tunable filter in a reception section of a wavelength division multiplexing (WDM) transmission node for demultiplexing a signal light having a desired wavelength from wavelength division multiplexed light (WDM light) including a plurality of multiplexed signal lights individually having different wavelengths and to a fabrication method of the acousto-optic device.

2. Description of the Related Art

In recent years, in order to achieve expansion of the transmission capacity and increase of the transmission distance, a WDM transmission system has been popularized. In an add/drop node (optical transmission apparatus) provided in a network which forms the WDM transmission system, a dropping (branching) process and an adding (inserting) process are performed for an inputted WDM light. For example, a plurality of signal lights of different channels included in the inputted WDM light are dropped and signal lights having desired wavelengths from among the wavelengths included in the local signal lights are selected and added and outputted to a WDM transmission line.

FIG. 17 is a diagrammatic view illustrating an add/drop (Add and Drop) function. An add/drop node 90 shown in FIG. 17 selects and drops one or more single wavelength lights (single lights) included in a WDM light from a repeating node 90a, and transmits the single lights to an optical network 90d. Further, the add/drop node 90 passes those single wavelength lights which are not to be dropped to a repeating node 90b therethrough, and adds one or more single wavelength lights from an optical network 90c to free wavelengths of the WDM light. This adding and dropping process is performed by an acousto-optic tunable filter (AOTF) 89 provided in the add/drop node 90.

The acousto-optic tunable filter 89 is an acousto-optic device and includes an input port 88a to which WDM light is to be inputted, an add port 88b to which local signal lights are to be inputted, a non-selection port 88c for outputting single wavelength lights which are not dropped, and a selection port 88d for outputting dropped single wavelength lights.

Consequently, the acousto-optic tunable filter 89 functions as a variable wavelength filter having both functions of a band-block filter and a band-pass filter. Further, this function is implemented in one chip, and is given attention also from the point of view of the cost.

As a material for a substrate of the acousto-optic tunable filter 89, $LiNbO_3$ (lithium niobate) is commonly used. However, in polar crystal of $LiNbO_3$ or the like, electric charge (polarization electrode) by spontaneous polarization is generated by a temperature variation or crystal distortion (in a normal state, such spontaneous polarization is neutralized by space charge).

Then, when a TE (Transverse Electric) wave and a TM (Transverse Magnetic) wave propagate along the surface of the substrate and the inside of the substrate spaced a little from the surface of the substrate, the TE wave is converted into a TM wave while the TM wave is converted into a TE wave.

Conventionally, methods for miniaturization, integration, reduction of the power consumption and the cost, improvement of the stability of operation of an acousto-optic tunable filter which can exhibit the add/drop function have been proposed (refer to Patent Documents 1 and 2).

A waveguide type optical device disclosed in the Patent Document 1 includes a substrate having an electro-optical effect, an optical wavelength, a dielectric layer on the optical waveguide, electrodes, and a conductive film layer which covers an exposed surface of the dielectric layer. Further, in the waveguide type optical device, electrical connection by the conductive film layer disposed between electrodes adjacent each other is cut at least along the direction of the waveguide, and part of the dielectric layer is exposed at the cut portion. This stabilizes the electrode characteristic of the waveguide type optical device and promotes the reliability thereof.

An electro-optic device disclosed in the Patent Document 2 includes a $LiNbO_3$ substrate including an optical waveguide formed on the upper side surface thereof, a buffer layer including a BCB dielectric material directly formed on the upper side surface of the $LiNbO_3$ substrate and having a thickness greater than 7000 angstrom, and an electrode formed on the upper side surface of the buffer layer, arranged to allow the electrode to receive an RF signal (Radio Frequency signal), so that the RF signal introduces an electric field to the optical waveguide. Consequently, an optical device having an improved temperature stability and including a discharging path for moving charge can be obtained, and formation of a strong electric field along the +z plane and the −z plane of z-cut $LiNbO_3$ crystal can be prevented.

Patent Document 1 Japanese Patent Laid-Open No. HEI 8-54589

Patent Document 2 Published Japanese Translation of a PCT Application, No. 2002-542511

However, charge generated in the z direction of the acousto-optic tunable filter has an influence on the refractive index of the substrate, and makes a factor to vary the filter characteristic (band pass characteristic) of the acousto-optic tunable filter.

Further, if electric charge generated by spontaneous polarization is accumulated in the electrodes (comb type electrode) provided for exciting a surface acoustic wave and is discharged between the electrodes, then there is the possibility that the electrodes or the substrate may be damaged.

SUMMARY OF THE INVENTION

It is an object of the present invention to provide an acousto-optic device and a fabrication method for the acousto-optic device which can achieve both of suppression of variation in characteristic and prevention of device damage, for example, in an optical device which utilizes an acousto-optic effect such as an acousto-optic tunable filter for WDM light, and can maintain a stabilized filtering operation.

(1) In order to attain the object described above, according to an aspect of the present invention, there is provided an acousto-optic device comprising a substrate on which a surface acoustic wave propagation region for guiding a surface acoustic wave and an optical waveguide for guiding an optical wave are provided, and a conductive neutralization wiring pattern provided in a region of the substrate other than the surface acoustic wave propagation region for neutralizing polarization charge generated on a surface of the substrate.

With the acousto-optic device, since it comprises a conductive neutralization wiring pattern provided in a region other than a surface acoustic wave propagation region for neutralizing polarization charge generated on a surface of the substrate, polarization charge generated by temperature variation or crystal distortion can be neutralized by the wiring pattern formed on the surface of the substrate. Consequently, characteristic degradation of the device can be prevented and a stabilized operation can be achieved.

(3) The acousto-optic device may be configured such that the substrate has a plurality of sets each including the surface acoustic wave propagation region and the optical waveguide, and the neutralization wiring pattern is formed so as to surround each of the surface acoustic wave propagation regions, portions of the neutralization wiring patterns which is formed between adjacent ones of the surface acoustic wave propagation regions being formed as a common portion shared along one line.

(4) The neutralization wiring pattern may be grounded and connected to one of electrodes for producing the surface acoustic wave or may be formed so as to surround the substrate.

(5) The substrate may include a first polarizing beam splitter for demultiplexing a wavelength division multiplexed light in which a plurality of wavelengths are multiplexed into a plurality of optical waves having polarization planes different from each other, a plurality of optical waveguides for individually propagating the plural optical waves demultiplexed by the first polarizing beam splitter, and a second polarizing beam splitter for selecting an optical wave having a desired wavelength based on the polarization planes of the plural optical waves propagated along the plural optical waveguides.

(6) The substrate may further include an excitation electrode for exciting the surface acoustic wave. In this instance, a buffer layer for preventing propagation loss of the optical waves in the excitation electrode may be formed between the substrate and the excitation electrode. Or, the substrate may further include an absorber for absorbing the surface acoustic wave propagated in the surface acoustic wave propagation region.

(7) The substrate may include an input port for receiving a wavelength division multiplexed light in which a plurality of single wavelength lights are multiplexed, a selection port for selecting and outputting one or more single wavelength lights from among the plural wavelengths included in the wavelength division multiplexed light inputted from the input port, and a non-selection port for outputting one or more single wavelength lights which are not selected by the selection port.

With the acousto-optic device of the configuration described, both of suppression of characteristic variation and prevention of device damage can be achieved, for example, in an optical device which utilizes an acousto-optic effect such as an acousto-optic tunable filter for WDM light or the like.

(8) According to another aspect of the present invention, there is provided a fabrication method of an acousto-optic device for forming an acousto-optic device including a substrate on which a surface acoustic wave propagation region for guiding a surface acoustic wave and an optical waveguide for guiding an optical wave are provided on a wafer substrate, comprising an excitation electrode forming step of forming an excitation electrode for exciting the surface acoustic wave on the wafer substrate, and a neutralization wiring pattern forming step of forming a conductive neutralization wiring pattern provided in a region of the substrate other than the surface acoustic wave propagation region for neutralizing polarization charge generated on a surface of the substrate.

With the fabrication method, since the neutralization wiring pattern is formed on the surface of the substrate, polarization charge generated by temperature variation or crystal distortion can be neutralized. Further, characteristic degradation of the device can be suppressed and a stabilized operation can be achieved.

(8) The neutralization wiring pattern forming step may include a second neutralization wiring pattern forming step of forming, individually for a plurality of such substrates, the neutralization wiring pattern in a region of the substrate other than the surface acoustic wave propagation region.

(9) The fabrication method may further comprise a vapor deposition step of vapor depositing conductive substance on a surface of the substrate, and a diffusion step of diffusing the conductive material vapor deposited at the vapor deposition step into the inside of the substrate.

(10) In this instance, the fabrication method may further comprise a buffer layer forming step of forming a pattern of a buffer layer for preventing propagation loss of the optical waves in the excitation electrode between the substrate and the excitation electrode.

(11) The fabrication method may further comprise a surface acoustic wave propagation region forming step of forming the surface acoustic wave propagation region.

(12) The fabrication method may further comprise a neutralization wiring pattern grounding step of grounding the neutralization wiring pattern formed at the neutralization wiring pattern forming step.

(13) In this instance, the fabrication method may further comprise a connection step of connecting the neutralization wiring pattern grounded at the neutralization wiring pattern grounding step and the excitation electrode formed at the excitation electrode forming step to each other.

(14) The fabrication method may further comprise a second neutralization wiring pattern forming step of forming the neutralization wiring pattern on a face different from that face of the surface of the substrate on which the surface acoustic wave propagation region is provided.

(15) The fabrication method may further comprise a thin film forming step of forming a conductive thin film on a face different from that face of the surface of the substrate on which the surface acoustic wave propagation region is provided.

With the fabrication method, a stabilized filtering operation can be maintained.

The above and other objects, features and advantages of the present invention will become apparent from the following description and the appended claims, taken in conjunction with the accompanying drawings in which like parts or elements are denoted by like reference characters.

BRIEF DESCRIPTION OF THE DRAWINGS

FIG. 3 is a schematic view showing a comb type electrode according to the embodiment of the present invention;

FIG. 4A is a diagrammatic view illustrating an input/output characteristic where a wavelength is selected according to the embodiment of the present invention;

FIG. 4B is a diagrammatic view illustrating an input/output characteristic where no wavelength is selected according to the embodiment of the present invention;

FIGS. 9A to 9D are diagrammatic views illustrating different fabrication steps where a plurality of pyro-electricity coping wiring patterns are formed according to the embodiment of the present invention;

FIG. 15 is a schematic view showing an eighth wiring pattern according to the embodiment of the present invention;

FIG. 16A is a schematic view showing a ninth wiring pattern according to the embodiment of the present invention;

FIG. 16B is a sectional view of the substrate taken along line A-A' of FIG. 16A.

DESCRIPTION OF THE PREFERRED EMBODIMENT

In the following, an embodiment of the present invention is described with reference to the drawings.

(A) Description of an Embodiment of the Present Invention

Figure 1:
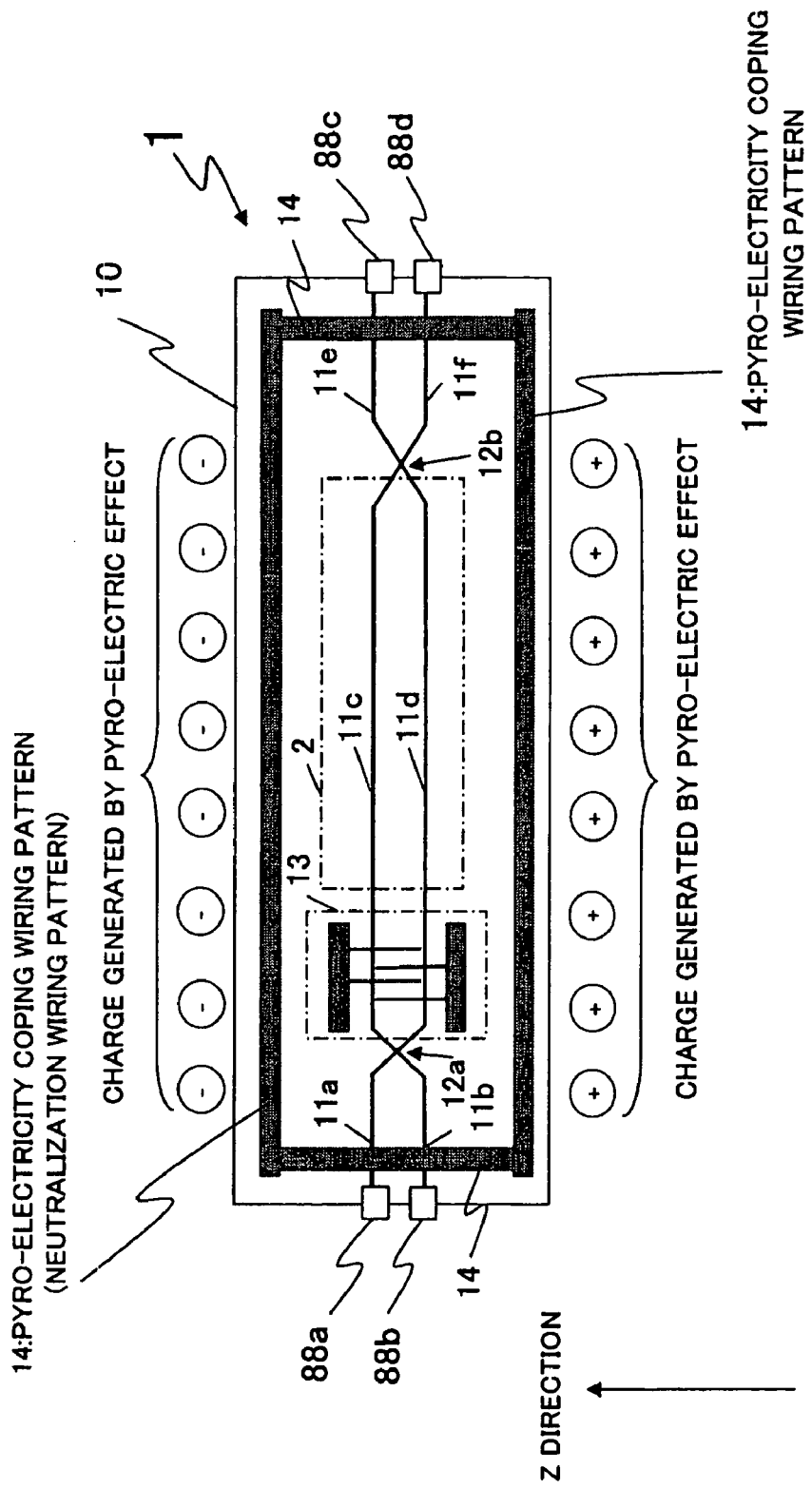
FIG. 1 is a top plan view of an acousto-optic tunable filter to which the present invention is applied.

FIG. 1 is a top plan view of an acousto-optic tunable filter (AOTF) to which the present invention is applied. Referring to FIG. 1, the acousto-optic tunable filter 1 shown includes a substrate 10 on which a SAW (Surface Acoustic Wave) guide (surface acoustic wave propagation region) 2 for guiding a surface acoustic wave and optical waveguides 11a, 11b, 11c, 11d, 11e and 11f for guiding optical waves (for example, inputted WDM light) are provided. The acousto-optic tunable filter 1 functions as a wavelength selection filter for filtering an optical wave having a desired wavelength using an acousto-optic effect between a surface acoustic wave and an optical wave.

As hereinafter described, the acousto-optic tunable filter 1 includes a pyro-electricity coping conductive wiring pattern (neutralization wiring pattern) 14 for neutralizing polarization charge generated on the surface of the substrate 10. The conductive wiring pattern (neutralization wiring pattern) 14 is provided in a region different from a region in which the SAW guide 2 is provided, for example, in such a manner as to surround the SAW guide 2 formed from a thin film or the like as hereinafter described. Further, on an upper face of the substrate 10 formed from a piezoelectric substrate of LiNbO$_3$ (lithium niobate) or the like, the optical waveguides 11a, 11b, 11c, 11d, 11e and 11f are formed, and an input side polarization beam splitter (PBS) 12a, an output side polarization beam splitter 12b, and a comb type electrode (Inter Digital Transducer: IDT or excitation electrode) 13 are provided. Further, as hereinafter described with reference to FIG. 3, the acousto-optic tunable filter 1 is connected to an RF signal oscillator (high-frequency signal oscillator) 50.

It is to be noted that, for example, as shown in FIG. 3, the "upper face" of the substrate 10 signifies a face on the upper side of the substrate 10, and the "surface" of the substrate 10 signifies a surface layer of the substrate 10.

(1) Substrate 10

The substrate 10 is formed by thermal diffusion of titanium Ti into a LiNbO$_3$ substrate having a birefringence property of light. It is to be noted that a substrate formed from a material having a piezoelectric effect different other than LiNbO$_3$ may be used.

Figure 2A:
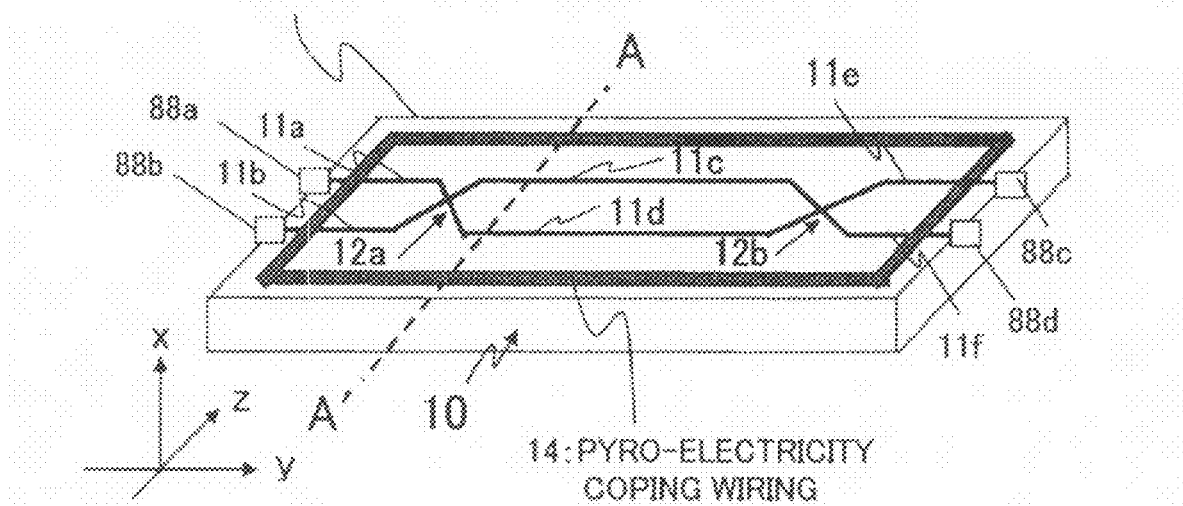
FIG. 2A is a perspective view of an acousto-optic tunable filter according to an embodiment of the present invention.

FIG. 2A is a perspective view of the acousto-optic tunable filter 1 according to the first embodiment of the present invention which is in an x-cut state. The x, y and z directions shown in FIG. 2A are a thicknesswise direction of the substrate 10, an advancing direction of passing light, and a depthwise direction of the substrate 10, respectively. Further, a voltage application direction is the z direction. Here, if a voltage is applied in the x direction to the substrate 10, then charge is generated in the +z and −z directions by a pyro-electric effect, and the substrate 10 is polarized in the +z and −z directions.

Figure 2B:
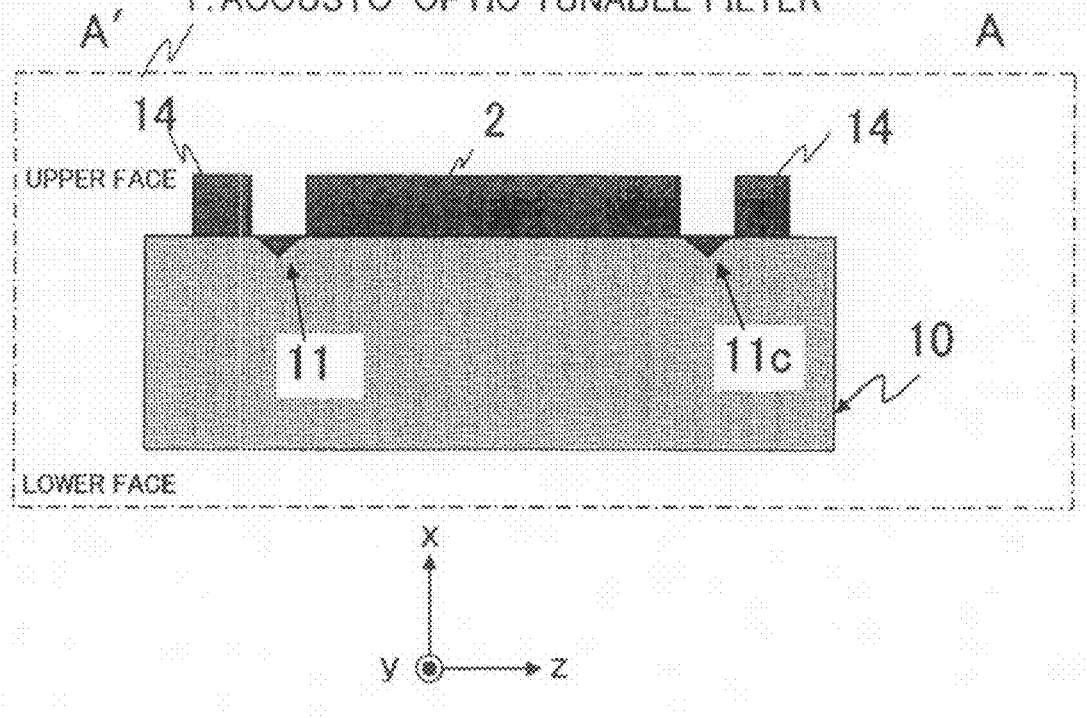
FIG. 2B is a sectional view of a LiNbO.sub.3 substrate taken along line A-A' of FIG. 2A.

A layer structure of the substrate 10 along line A-A' in FIG. 2A is shown in FIG. 2B. The SAW guide 2 shown in FIG. 2B is formed from a thin film as hereinafter described with reference to FIGS. 6C and 6H (the structure of the SAW guide 2 of the present invention is not limited to this particular structure). It is to be noted that, preferably, for portions at which the pyro-electricity coping wiring pattern 14 shown in FIG. 2B intersects with the optical waveguides 11a, 11b, 11e and 11f, a buffer layer (not shown) is provided under the pyro-electricity coping wiring pattern 14.

(2) Upper Face of the Substrate 10

The optical waveguides 11a to 11f, input side polarization beam splitter 12a and output side polarization beam splitter 12b are formed on the upper face of the substrate 10 shown in FIG. 2A.

(2-1) Optical Waveguides 11a to 11f (i) The optical waveguides 11a and 11b are provided in order to propagate two optical waves demultiplexed by the input side polarization beam splitter 12a, and are connected to an input port 88a for inputting WDM light and an add port 88b for inputting add light (which is light to be added to the WDM light), respectively.

(ii) The optical waveguides 11c and 11d function as TE-TM mode conversion sections by an interaction with a surface acoustic wave hereinafter described.

(iii) The optical waveguides 11e and 11f are connected to a non-selection port 88c and a selection port 88d, and output a selected signal light and a non-selected signal light from within inputted WDM light, respectively. The selection port 88d selects and outputs one or more single wavelength lights from among n wavelengths included in the WDM light inputted from the input port 88a. The non-selection port 88c outputs one or more single wavelength lights which are not selected by the selection port 88d.

(2-2) Input Side Polarization Beam Splitter (First Polarization Beam Splitter) 12a and Output Side Polarization Beam Splitter (Second Polarization Beam Splitter) 12b The input side polarization beam splitter 12a demultiplexes WDM light including n wavelengths multiplexed with each other into two optical waves having polarization planes different from each other and branches the demultiplexed optical waves towards the optical waveguides 11c and 11d. Meanwhile, the output side polarization beam splitter 12b selects both or one of optical waves propagated in the optical waveguides 11c and 11d based on the polarization planes of the optical waves. Consequently, the two optical waves of the TE wave and TM wave are propagated in the optical waveguides 11c and 11d, and the polarization planes of the TE wave and TM wave are rotated in a mode conversion region (a region in which an optical wave having a specific wavelength and a surface acoustic wave interact with each other) to convert the modes of the TE wave and TM wave. Passing lights from between the mode converted optical waves are selected, and the selected lights and the other non-selected lights are branched and outputted from the selection port 88d and the non-selection port 88c, respectively.

(2-3) Excitation of Surface Acoustic Waves in the Optical Waveguides 11c and 11d FIG. 3 is a schematic view showing the comb type electrode 13 according to the embodiment of the present invention. In FIG. 3, like elements to those described above are denoted by like reference characters.

Here, the RF signal oscillator 50 oscillates, for example, for a signal light of approximately 1.5 .mu.m, a controlling high-frequency signal (for example, RF signal, sinusoidal wave or sine wave) of 170 MHz. Further, by variation of the oscillation frequency, a wavelength of a signal light to be filtered is selected.

(2-4) Comb Type Electrode (IDT) 13

The comb type electrode 13 excites a surface acoustic wave using the controlling RF signal oscillated by the RF signal oscillator 50, and includes, as an example of a shape of the electrode, electrodes 13a and 13b for inputting and outputting the RF signal and electrode fingers 13c to 13f having a period substantially equal to the wavelength of the surface acoustic wave to be excited. Further, the comb type electrode 13 is connected to a switch 69 for changing over the RF signal between connection to and disconnection from the comb type electrode 13. If the RF signal is applied between the input and output electrodes 13a and 13b, then crystal distortion is generated in the inside of the substrate 10 by a piezoelectric effect, and the crystal distortion propagates as a surface acoustic wave in a longitudinal direction (FIG. 1 and so forth) of the substrate 10.

(2-5) Wavelength Selection Function of the Acousto-optic Tunable Filter

FIG. 4A is a diagrammatic view illustrating an input/output characteristic where a wavelength is selected according to the embodiment of the present invention, and, in FIGS. 4A and 4B, like elements to those described above are denoted by like reference characters. Further, an intensity characteristic (input characteristic) of signal light is a fixed intensity within a range, for example, from 1,530 nm to 1,610 nm. Here, where the switch 69 shown in FIG. 4A is on, a TE wave and a TM wave of a signal light having, for example, a wavelength of 1545 nm are rotated and converted into a TM wave and a TE wave by the optical waveguides 11c and 11d, respectively. Further, a light having the wavelength of 1545 nm included in the TE wave and the TM wave is selected by the output side polarization beam splitter (not shown), and the selected light is outputted from the selection port 88d. Meanwhile, non-selected lights other than the rotated signal light are outputted from the non-selection port 88c (FIG. 1). Consequently, as shown from an intensity characteristic (output characteristic) of signal light, a function as a band-pass filter is achieved.

Meanwhile, FIG. 4B is a diagrammatic view illustrating an input/output characteristic where no wavelength is selected according to the embodiment of the present invention. Where the switch 69 shown in FIG. 4B is off, the selection light does not appear in the output characteristics of the TE wave and TM wave.

In this manner, wavelength division multiplexed signal light of n waves can be demultiplexed into the selection light and the non-selection lights.

(2-6) Modification

Figure 5:
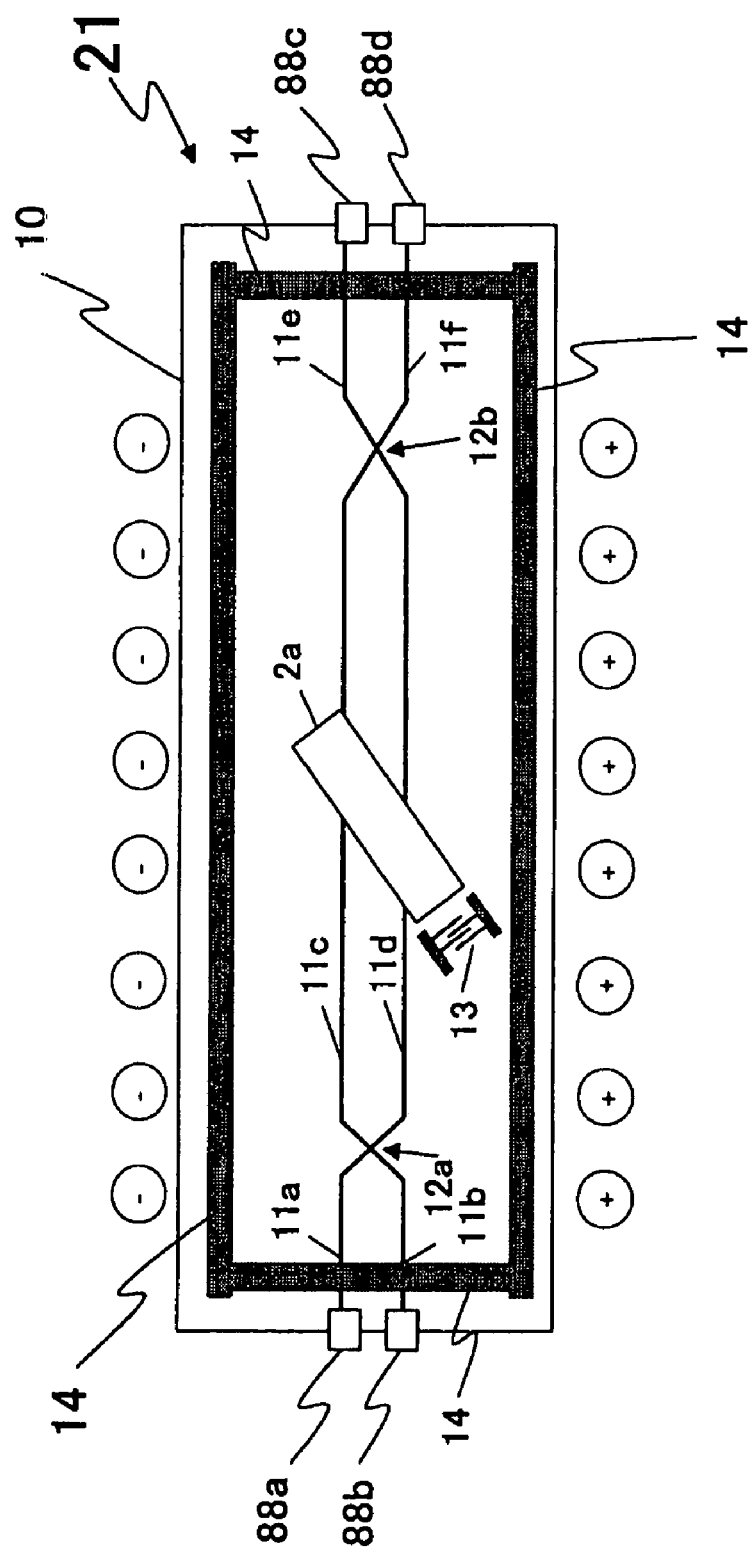
FIG. 5 is a diagrammatic view showing an example of a configuration of a modification to the acousto-optic tunable filter according to the embodiment of the present invention.

It is to be noted that FIG. 5 is a schematic view showing a configuration of a modification to the acousto-optic tunable filter according to the embodiment of the present invention. Referring to FIG. 5, the acousto-optic tunable filter 21 shown is configured such that the comb type electrode 13 is inclined with respect to a center line in a longitudinal direction of the substrate 10, and a SAW guide 2a is formed in a direction same as an advancing direction of a surface acoustic wave excited by the comb type electrode 13.

(3) Pyro-electricity Coping Wiring Pattern 14 (Neutralization Wiring Pattern of the Acousto-Optic Tunable Filter 1)

A pyro-electricity coping wiring pattern 14 is formed so as to connect both ends in the z direction (polarization direction) of the upper face of the substrate 10 to each other, and is formed along an outer periphery of the upper face, on which the SAW guide 2 is provided, from within the surface of the substrate 10 such that a region wherein an acousto-optic effect is generated is surrounded. Further, since the pyro-electricity coping wiring pattern 14 is electrically closed, charge generated on the upper face of the substrate is neutralized.

In this manner, with the present acousto-optic tunable filter 1, polarization charge generated on the upper face of the substrate 10 formed from LiNbO.sub.3 can be neutralized, and therefore, a stabilized wavelength selection function can be exhibited.

(4) Fabrication Steps of the Acousto-optic Tunable Filter 1

Next, a fabrication method of the acousto-optic tunable filter 1 is described in detail with reference to FIGS. 6A to 6J.

Figure 6:
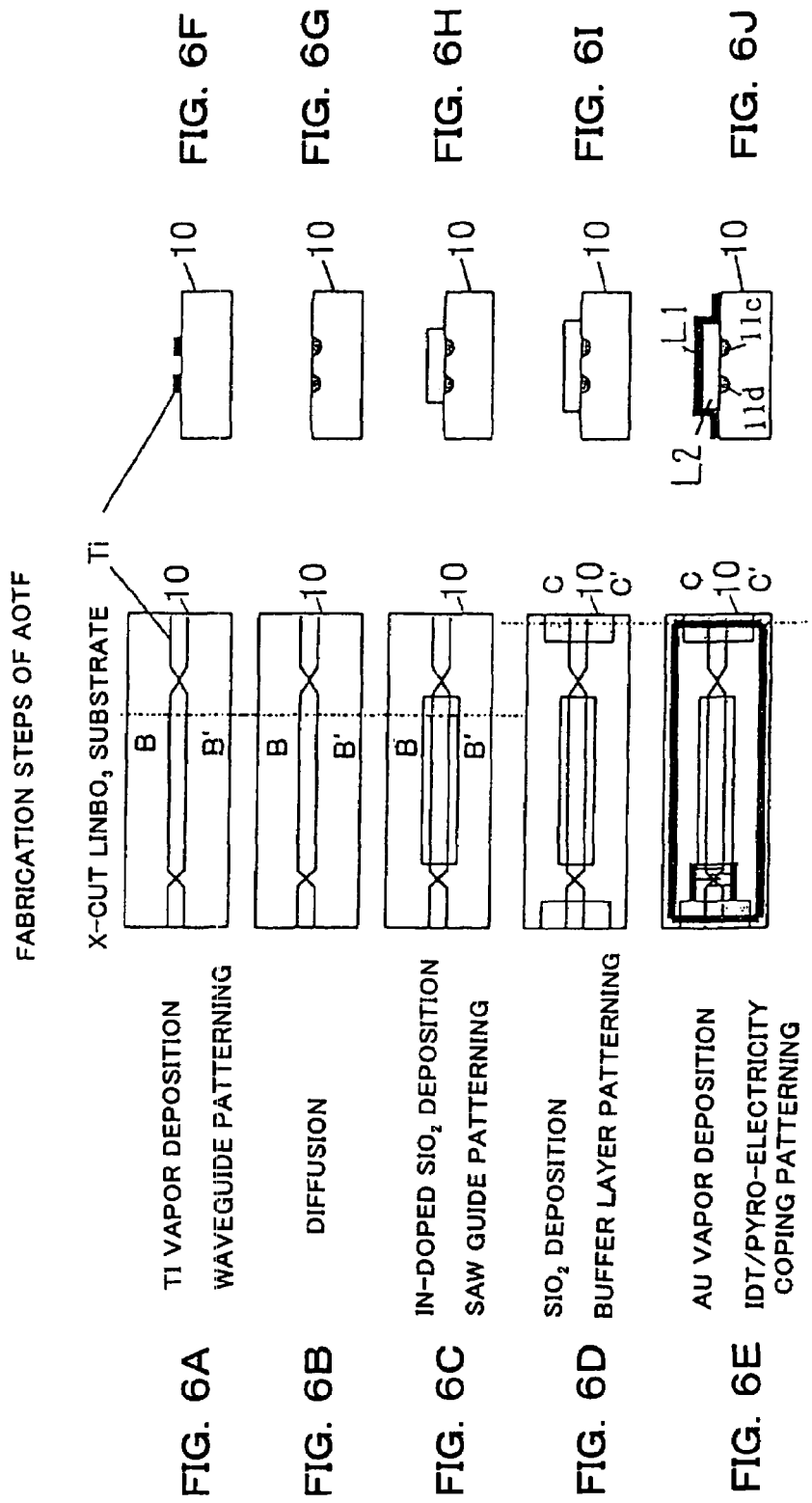
FIGS. 6A to 6J are schematic views illustrating fabrication steps of the acousto-optic tunable filter according to the embodiment of the present invention.

FIGS. 6A to 6J are schematic views illustrating fabrication steps of the acousto-optic tunable filter according to the embodiment of the present invention. In particular, FIGS. 6A to 6E are top plan views of the substrate 10. FIGS. 6F to 6H are sectional views of the substrate 10 taken along line B-B' of FIGS. 6A to 6C, respectively. Further, FIGS. 6I and 6J are sectional views of the substrate 10 taken along line C-C' of FIGS. 6D and 6E, respectively.

(i) At a first step, titanium Ti is vapor deposited on the upper face of the substrate 10 (FIG. 2A and so forth) to perform patterning for the optical waveguides 11a to 11f (FIG. 6A) and form the pyro-electricity coping wiring pattern 14 on the upper face of the substrate 10 (FIG. 6F).

(ii) At a next step, titanium Ti is diffused into the inside of the substrate 10 (FIG. 6G).

(iii) At a further step, silica (silicon dioxide) SiO.sub.2 doped with indium In is deposited at a portion which is to be formed as the mode conversion region, and patterning for the SAW guide 2 for guiding a surface acoustic wave is performed (FIGS. 6C and 6H).

(iv) At a succeeding step, silica SiO.sub.2 is deposited at both of an input side end potion and an output side end portion (in the longitudinal direction) of the substrate 10 to perform patterning for the buffer layer (not shown) (FIGS. 6D and 6I).

Accordingly, in the fabrication method of the present acousto-optic tunable filter 1, the pattern for the buffer layer for preventing propagation loss of an optical wave in the comb type electrode 13 is formed between the substrate 10 and the comb type electrode 13 (buffer layer forming step).

(v) Then, through vapor deposition of gold Au, patterning of wiring lines for both of the comb type electrode 13 and the pyro-electricity coping wiring pattern 14 is performed (FIGS. 6E and 6J).

The comb type electrode 13 and the pyro-electricity coping wiring pattern 14 are formed in this manner. Here, in FIG. 6J, reference characters L1 and L2 denote a vapor deposited Au layer and the SAW guide 2 on which silica $SiO_2$ doped with In is deposited, respectively, and the optical waveguides 11c and 11d are formed in the substrate 10.

In summary, in the fabrication method of the present acousto-optic tunable filter 1, the acousto-optic tunable filter 1 as an acousto-optic device having the substrate 10 on which the SAW guide 2 for guiding a surface acoustic wave and the optical waveguides 11c and 11d for guiding optical waves are provided is formed on a wafer (not shown).

First, the comb type electrode 13 for exciting a surface acoustic wave is formed on the substrate 10 of the wafer (excitation electrode forming step).

Then, the conductive pyro-electricity coping wiring pattern 14 provided in a region of the substrate other than the region where the SAW guide 2 is provided for neutralizing polarization charge generated on the surface of the substrate is formed (neutralization wiring pattern forming step).

Thereafter, a conductive material is vapor deposited on the surface of the substrate 10 (vapor deposition step) and the conductive material vapor deposited at the vapor deposition step is diffused into the inside of the substrate (diffusion step), and the SAW guide 2 is formed (surface acoustic wave propagation region forming step).

The comb type electrode 13 and the pyro-electricity coping wiring pattern 14 are formed in this manner.

Next, a fabrication method of a device wherein a plurality of (for example, 3) pyro-electricity coping wiring patterns 14 are formed on the same wafer to integrate a plurality of chips is described. Here, an acousto-optic tunable filter of FIG. 8 hereinafter described is a basic acousto-optic tunable filter, and FIGS. 7A to 7F and 9A to 9D individually indicate arrangements wherein a groove is provided between adjacent acousto-optic tunable filters as a countermeasure against leakage of a surface acoustic wave.

Figure 7:
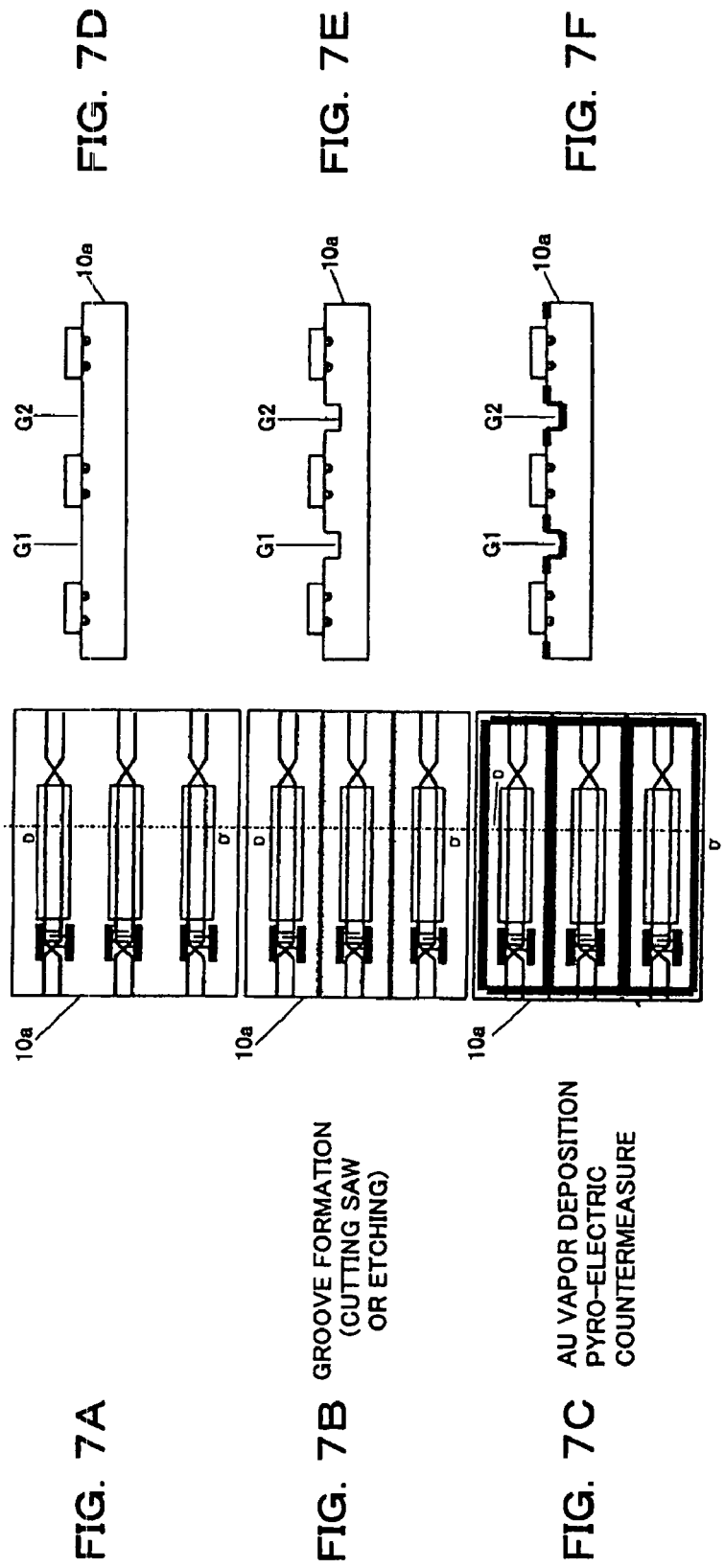
FIGS. 7A to 7F are schematic views illustrating fabrication steps where a plurality of pyro-electricity coping wiring patterns are formed according to the embodiment of the present invention.

FIGS. 7A to 7F are schematic views illustrating fabrication steps where, for example, 3 pyro-electricity coping wiring patterns 14 according to the embodiment of the present invention are formed. A substrate 10a shown in FIGS. 7A to 7F has three acousto-optic tunable filters 1 formed on one wafer. Here, FIGS. 7A to 7C are top plan views of the wafer, and FIGS. 7D to 7F are sectional views of the wafer shown in FIGS. 7A to 7C taken along line D-D', respectively. Further, in the following fabrication steps, it is assumed that the formation of the pyro-electricity coping wiring patterns 14 is started in a state wherein the comb type electrode 13 is formed in FIGS. 7A to 7C.

(i) At a first step, patterning of the SAW guide 2 is performed (FIGS. 7A and 7D).

(ii) At a next step, grooves G1 and G2 are formed on the substrate 10a using a cutting saw or by etching (FIGS. 7B and 7E). Naturally, here, the grooves G1 and G2 need not necessarily be formed in the fabrication process.

(iii) At a further step, gold Au is vapor deposited in the grooves G1 and G2 to form the pyro-electricity coping wiring patterns 14 (FIGS. 7C and 7F).

Or else, in FIGS. 7A to 7F, two or four or more pyro-electricity coping wiring patterns 14 may be formed. Since the fabrication steps of the two or four or more pyro-electricity coping wiring patterns 14 are same as those in the formation of the three pyro-electricity coping wiring patterns 14, overlapping description thereof is omitted herein.

Figure 8:
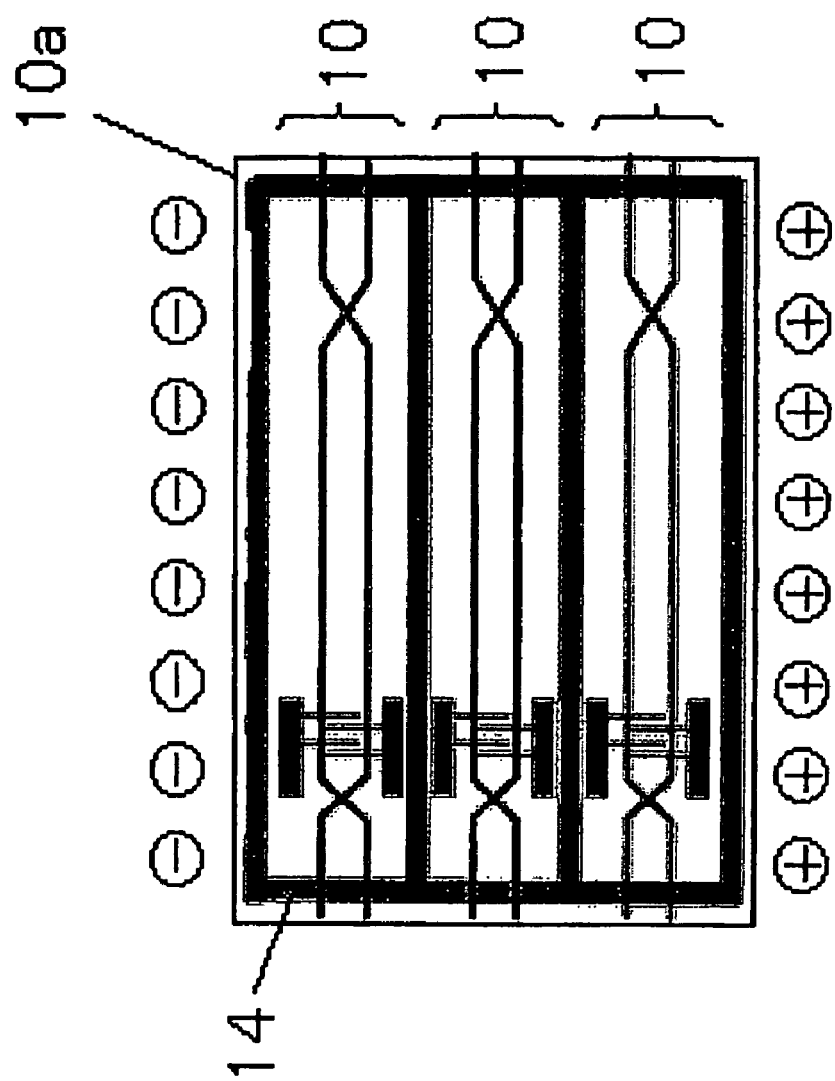
FIG. 8 is a top plan view of a chip fabricated through the fabrication steps shown in FIGS. 7A to 7F.

FIG. 8 is a top plan view of the chip fabricated through the fabrication steps illustrated in FIGS. 7A to 7F. Referring to FIG. 8, the substrate 10a shown has three substrates 10, and the pyro-electricity coping wiring patterns (neutralization wiring patterns) 14 are formed so as to surround the three substrates 10. In particular, three acousto-optic tunable filters are fabricated on the wafer (not shown) in a state wherein they are surrounded by the pyro-electricity coping wiring patterns 14. While the pyro-electricity coping wiring patterns 14 in the foregoing description are formed in the grooves, the pyro-electricity coping wiring patterns 14 may be formed otherwise without providing the grooves.

Accordingly, the acousto-optic tunable filter according to the present fabrication method has three sets of the SAW guide 2 and optical waveguides 11a, 11b, 11c, 11d, 11e and 11f. The pyro-electricity coping wiring patterns 14 are formed so as to surround the individual SAW guides 2, and a pattern portion formed between the SAW guides 2 can be configured so as to be shared along one line.

Further, since the pyro-electricity coping wiring patterns 14 are formed using steps same as the forming steps of the wiring pattern for the comb type electrode 13, although the pyro-electric countermeasure is taken, the number of steps does not increase.

In this manner, at the pyro-electric-coping wiring pattern forming step, the pyro-electricity coping wiring patterns 14 are formed, for each of the three substrates 10, in a region other than the region wherein the SAW guide 2 is provided (second neutralization wiring pattern forming step).

FIGS. 9A to 9D are schematic views illustrating different fabrication steps where, for example, three pyro-electricity coping wiring patterns 14 according to the embodiment of the present invention are formed. In particular, FIGS. 9A and 9B are top plan views of a wafer, and FIGS. 9C and 9D are sectional views of the substrate 10a shown in FIGS. 9A and 9B taken along line E-E', respectively.

(i) At a first step, gold Au is vapor deposited and patterning of the comb type electrode 13 and the pyro-electricity coping wiring patterns 14 is performed (FIG. 9A). Here, the gold Au remains on an upper face of the substrate 10a (FIG. 9C).

(ii) At a next step, grooves are formed on the substrate 10a using a cutting saw or by etching (FIGS. 9B and 9D).

Further, in the FIGS. 9A to 9D, also the number of sets of the SAW guide 2 and optical waveguides 11a, 11b, 11c, 11d, 11e and 11f may otherwise be two or four or more. In particular, two or four or more pyro-electricity coping wiring patterns 14 may be formed. Since also the forming steps of the two or four or more pyro-electricity coping wiring patterns 14 are same as the forming steps for forming three pyro-electricity coping wiring patterns 14, overlapping description thereof is omitted herein.

In this manner, the grooves can be formed on the surface of the substrate 10a after metal is vapor deposited on the surface of the substrate 10a.

Figure 10:
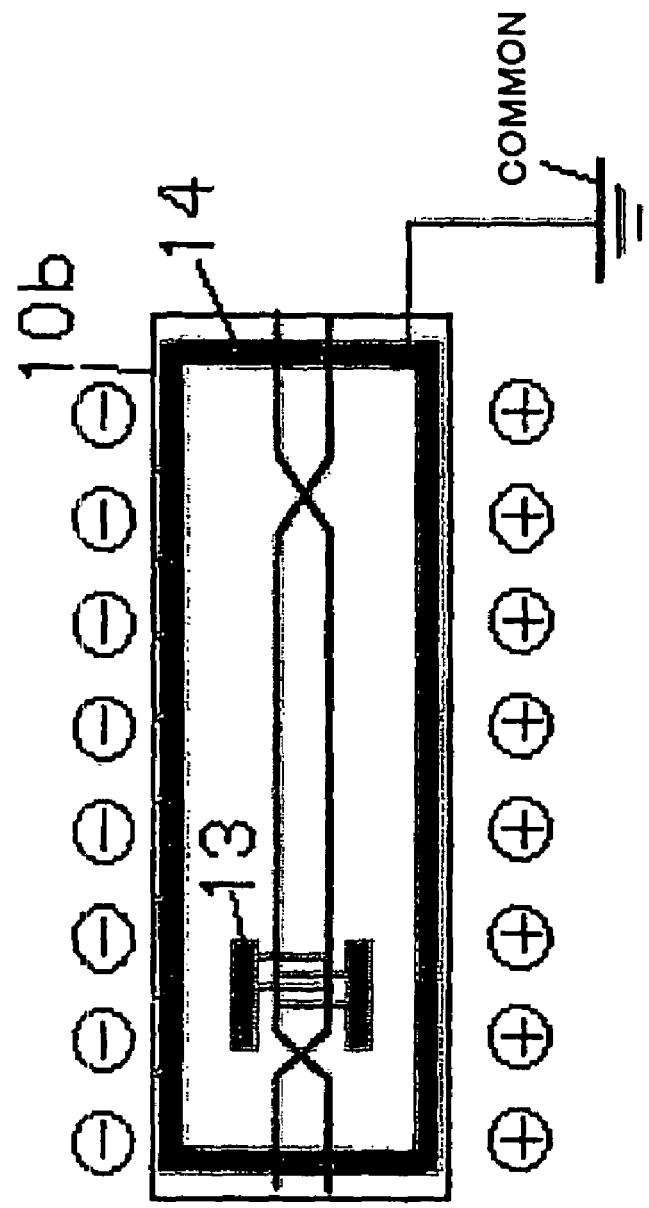
FIG. 10 is a schematic view showing a third wiring pattern according to the embodiment of the present invention.

FIG. 10 is a schematic view showing a third wiring pattern according to the embodiment of the present invention. Referring to FIG. 10, the substrate 10b shown has an electrically closed pyro-electricity coping wiring pattern 14 formed thereon, and the pyro-electricity coping wiring pattern 14 is grounded. The fabrication method of the substrate 10b shown in FIG. 10 includes steps described in (i) to (iii) below.

(i) The pyro-electricity coping wiring pattern 14 is formed along an outer periphery of the surface of the substrate 10b in such a manner as to surround the device region.

(ii) The pyro-electricity coping wiring pattern 14 is formed in accordance with a step same as the wiring pattern forming step of the comb type electrode 13.

(iii) The pyro-electricity coping wiring pattern 14 formed at the neutralization wiring pattern forming step of (ii) above is grounded (neutralization wiring pattern grounding step).

In this manner, the substrate 10b on which the pyro-electricity coping wiring pattern 14 is grounded is obtained.

Figure 11:
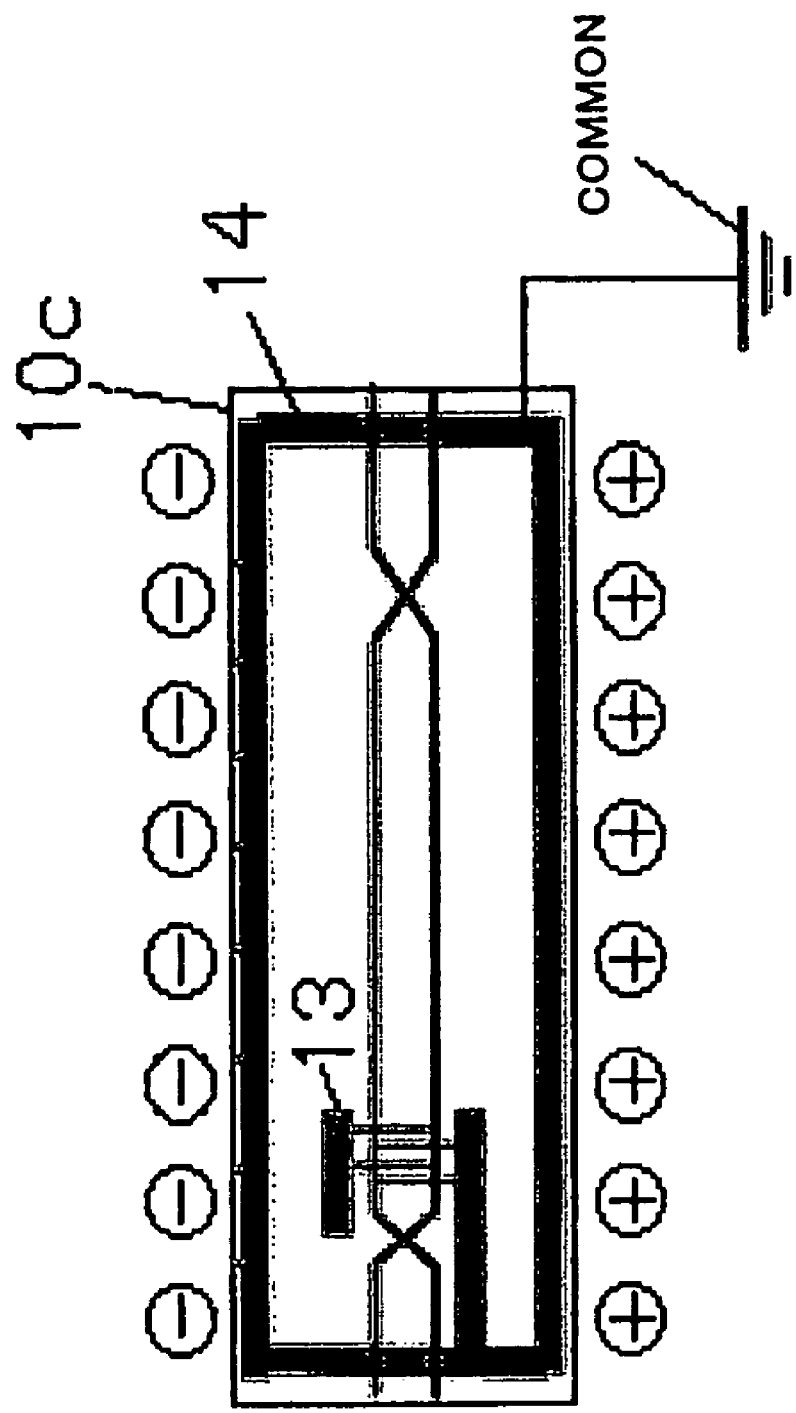
FIG. 11 is a schematic view showing a fourth wiring pattern according to the embodiment of the present invention.

FIG. 11 is a schematic view showing a fourth wiring pattern according to the embodiment of the present invention. Referring to FIG. 11, in the substrate 10c shown, the pyro-electricity coping wiring pattern 14 is grounded and connected to one of the electrodes 13a and 13b of the comb type electrode 13 for producing a surface acoustic wave. The fabrication method of the acousto-optic tunable filter shown in FIG. 11 includes steps described in (i) to (iv) below.

(i) The pyro-electricity coping wiring pattern 14 is formed along an outer periphery of the surface of the substrate 10c in such a manner as to surround the device region.

(ii) The pyro-electricity coping wiring pattern 14 is formed in accordance with a step same as the wiring pattern forming step of the comb type electrode 13.

(iii) The pyro-electricity coping wiring pattern 14 is grounded.

(iv) The pyro-electricity coping wiring pattern 14 grounded at the neutralization wiring pattern grounding step of (iii) and one of the electrodes 13a and 13b of the comb type electrode 13 formed at the excitation electrode forming step are connected to each other.

Consequently, the number of man-hours in bonding of the comb type electrode 13 is reduced.

The pyro-electricity coping wiring pattern 14 may be formed also on the rear side face (rear face) of any of the substrates 10 to 10d.

Figure 12:
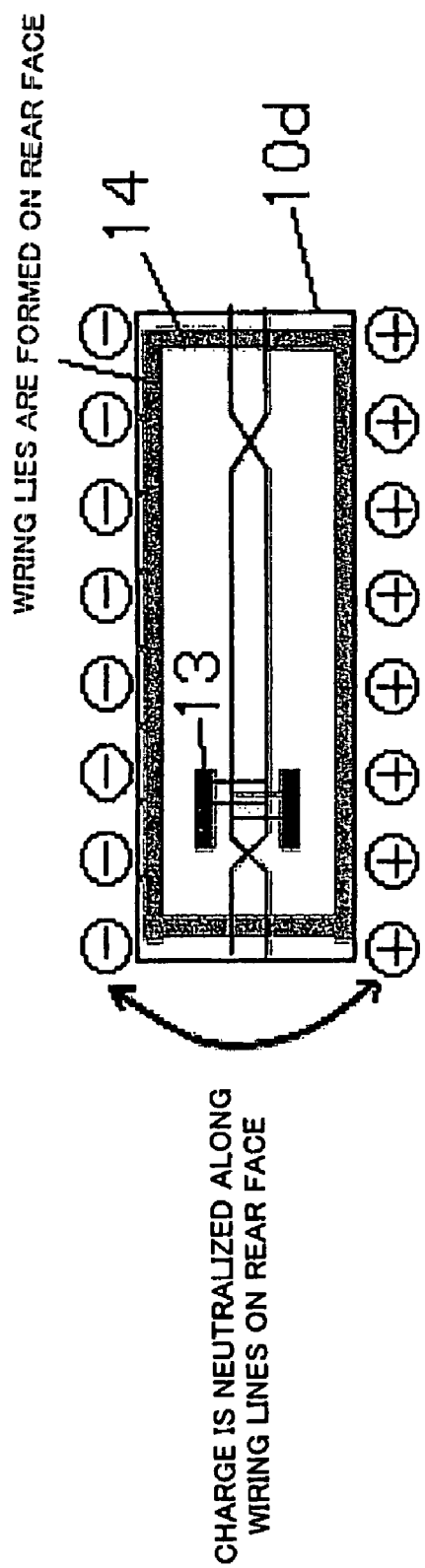
FIG. 12 is a schematic view showing a fifth wiring pattern according to the embodiment of the present invention.

FIG. 12 is a schematic view showing a fifth wiring pattern according to the embodiment of the present invention. Referring to FIG. 12, the pyro-electricity coping wiring pattern 14 is formed on the rear face of the substrate 10, 10c or the like so that polarization charge is neutralized through the pyro-electricity coping wiring pattern 14 on the rear face. The fabrication method of the acousto-optic tunable filter shown in FIG. 12 includes steps described in (i) to (iii) below.

(i) The pyro-electricity coping wiring pattern 14 is formed along an outer periphery of the surface of the substrate 10d in such a manner as to surround the device region.

(ii) The pyro-electricity coping wiring pattern 14 is formed in accordance with a step same as the wiring pattern forming step of the comb type electrode 13.

(iii) The pyro-electricity coping wiring pattern 14 is formed on the rear face.

Consequently, charge is neutralized through the pyro-electricity coping wiring pattern 14 formed on the rear face.

Figure 13:
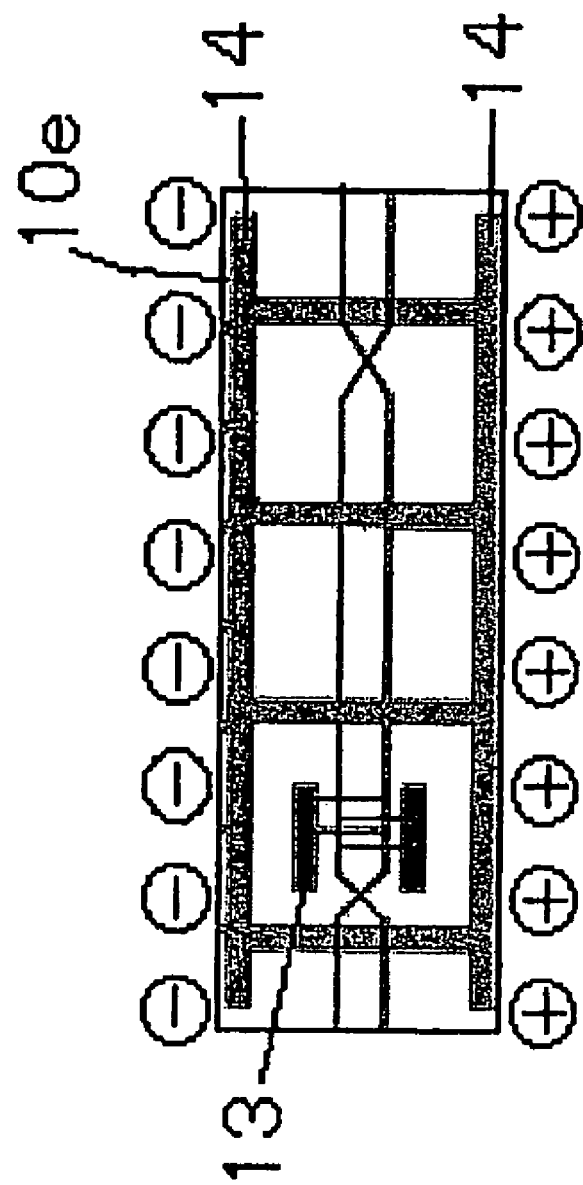
FIG. 13 is a schematic view showing a sixth wiring pattern according to the embodiment of the present invention.

FIG. 13 is a schematic view showing a sixth wiring pattern according to the embodiment of the present invention. Referring to FIG. 13, the pyro-electricity coping wiring pattern 14 shown is provided on the rear face but does not extend along an outer periphery of the substrate 10e. Accordingly, when the pyro-electricity coping wiring pattern 14 is to be formed on the rear face, it can be formed at any desired place or portion irrespective of the position of the device region. The fabrication method of the acousto-optic tunable filter shown in FIG. 13 is same as that of the acousto-optic tunable filter shown in FIG. 12, and overlapping description thereof is omitted herein.

Figure 14A:
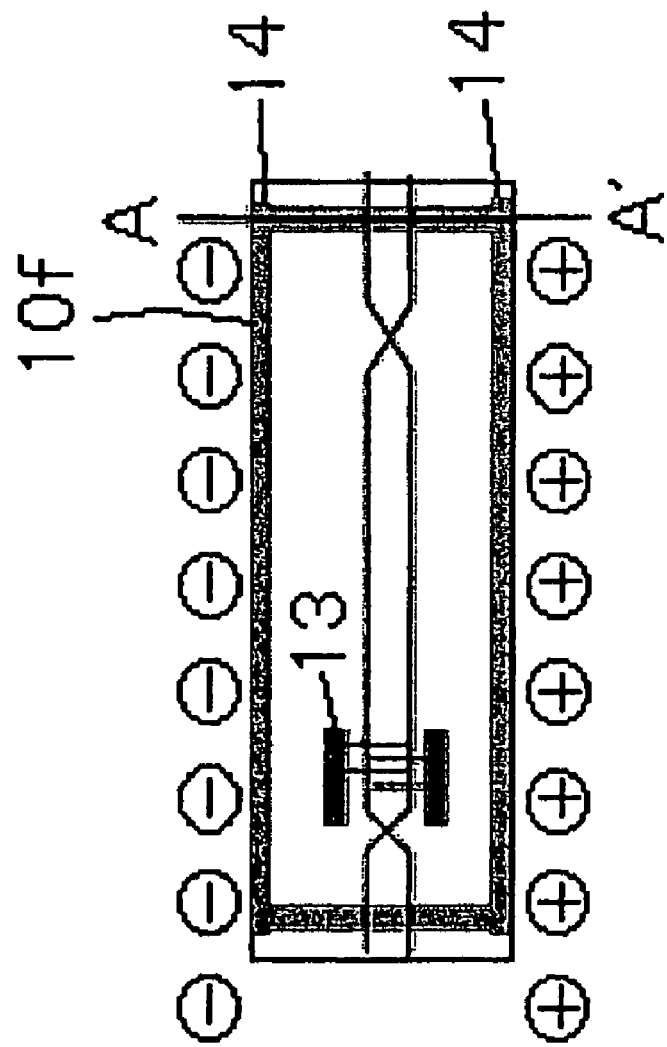
FIG. 14A is a schematic view showing a seventh wiring pattern according to the embodiment of the present invention.
Figure 14B:
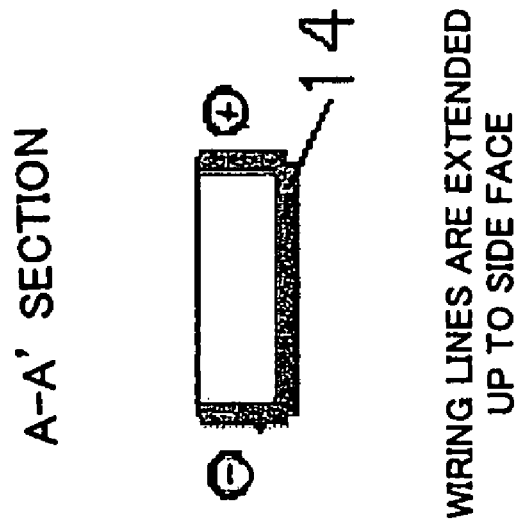
FIG. 14B is a sectional view of the substrate taken along line A-A' of FIG. 14A.

FIG. 14A is a schematic view showing a seventh wiring pattern according to the embodiment of the present invention, and FIG. 14B is a sectional view of the seventh wiring pattern according to the embodiment of the present invention taken along line A-A' of FIG. 14A. Referring to FIG. 14A, the pyro-electricity coping wiring pattern 14 is extended to side faces of the substrate 10f. The fabrication method of the acousto-optic tunable filter shown in FIGS. 14A and 14B includes steps described in (i) to (iv) below.

(i) The pyro-electricity coping wiring pattern 14 is formed along an outer periphery of the surface of the substrate 10b in such a manner as to surround the device region.

(ii) The pyro-electricity coping wiring pattern 14 is formed in accordance with a step same as the wiring pattern forming step of the comb type electrode 13.

(iii) The pyro-electricity coping wiring pattern 14 is formed on the rear face.

(iv) The pyro-electricity coping wiring pattern 14 is formed so as to extend to the side faces.

Accordingly, at each step illustrated in FIGS. 14A and 14B, the pyro-electricity coping wiring pattern 14 is formed on those side faces from within the surface of the substrate 10f which are different from the upper face on which the SAW guide 2 is provided (second neutralization wiring pattern forming step).

Consequently, a higher neutralization effect can be achieved.

FIG. 15 is a schematic view showing an eighth wiring pattern according to the embodiment of the present invention. Referring to FIG. 15, in the acousto-optic tunable filter shown, the conductive thin film 19 is formed on the rear face of the substrate 10g. Further, the pyro-electricity coping wiring pattern 14 is formed on the rear face so that charge can be removed more efficiently. The fabrication method of the acousto-optic tunable filter shown in FIG. 15 includes steps described in (i) to (v) below.

(i) The pyro-electricity coping wiring pattern 14 is formed along an outer periphery of the surface of the substrate 10g in such a manner as to surround the device region.

(ii) The pyro-electricity coping wiring pattern 14 is formed in accordance with a step same as the wiring pattern forming step of the comb type electrode 13.

(iii) The pyro-electricity coping wiring pattern 14 is formed on the rear face.

(iv) The rear face is covered with the conductive film 19. In particular, the conductive film 19 is formed on that face (rear face) from within the surface of the substrate 10g which is different from the face (upper face) on which the SAW guide 2 is provided (thin film forming step).

(v) The pyro-electricity coping wiring pattern 14 is formed such that it extends to the side faces.

Consequently, also the rear face of the substrate 10g is covered with the conductive thin film 19, and polarization charge on the surface of the substrate 10g is neutralized through the conductive thin film 19. Consequently, a higher neutralization effect can be achieved.

FIG. 16A is a schematic view showing a ninth wiring pattern according to the embodiment of the present invention, and FIG. 16B is a sectional view of a substrate 10h shown in FIG. 16A taken along line A-A'.

Also side faces of the substrate 10h shown in FIG. 16B can be covered with the conductive thin film 19. The fabrication method of the acousto-optic tunable filter shown in FIG. 16A includes steps described in (i) to (vi) below.

(i) The pyro-electricity coping wiring pattern 14 is formed along an outer periphery of the surface of the substrate 10h in such a manner as to surround the device region.

(ii) The pyro-electricity coping wiring pattern 14 is formed in accordance with a step same as the wiring pattern forming step of the comb type electrode 13.

(iii) The pyro-electricity coping wiring pattern 14 is formed on the rear face.

(iv) The rear face is covered with the conductive thin film 19.

(v) The pyro-electricity coping wiring pattern 14 is formed on the side faces.

(vi) The side faces are covered with the conductive thin film 19.

Accordingly, the step illustrated in FIGS. 16A and 16B forms the pyro-electricity coping wiring pattern 14 on one or both of those side faces and rear face from within the surface of the substrate 10h which are different from the upper face on which the SAW guide 2 is provided (second neutralization wiring pattern forming step). Further, this step forms the conductive thin film 19 on one or both of those side faces and rear face from within the surface of the substrate 10h which are different from the upper face on which the SAW guide 2 is provided (thin film forming step) Consequently, since the conductive thin film 19 is deposited also on the side faces of the substrate 10h, polarization charge is neutralized.

In this manner, the fabrication method of the acousto-optic tunable filter can neutralize polarization charge generated by a temperature variation or a pressure variation by means of the pyro-electricity coping wiring pattern 14 formed on the surface of the substrate 10a to 10h to suppress deterioration in characteristic of the device.

In this manner, with the present acousto-optic device 1, both of suppression of characteristic variation and prevention of damage to the device in a variable wavelength filter for WDM light can be achieved, and a stabilized filtering operation can be maintained.

(B) Others

The present invention is not limited to the embodiment and the modification specifically described above, and variations and modifications can be made without departing from the scope of the present invention.

Figure 17:
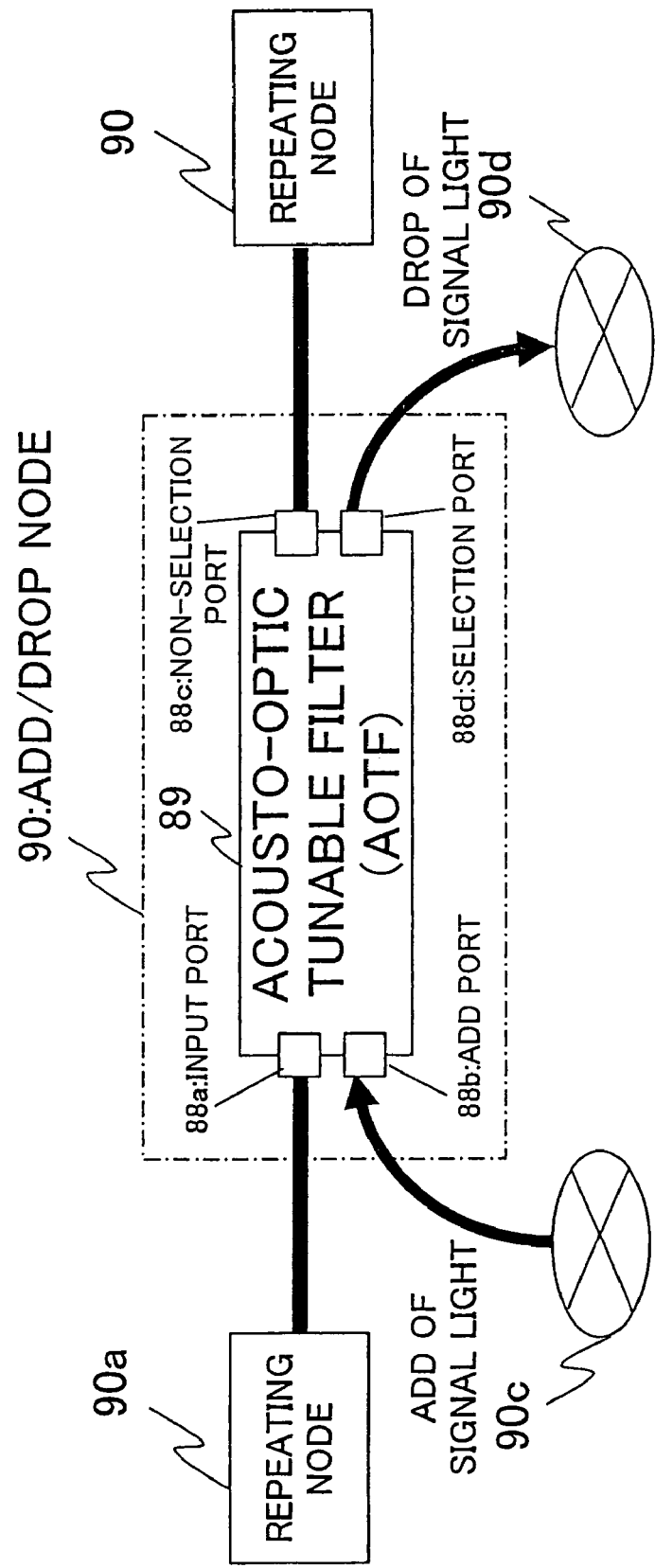
FIG. 17 is schematic view illustrating an add/drop function.

An acousto-optic tunable filter fabricated by the fabrication method of an acousto-optic filter can be used in an add/drop node (refer to, for example, FIG. 17) and functions as a band-block filter or a band-pass filter.

What is claimed is:

1. A fabrication method of an acousto-optic device for forming an acousto-optic device on a substrate and which includes a surface acoustic wave propagation region for guiding a surface acoustic wave and an optical waveguide for guiding an optical wave, comprising:

forming, on the substrate, an excitation electrode for exciting the surface acoustic wave; and forming a conductive neutralization wiring pattern in a region of the substrate other than the surface acoustic wave propagation region for neutralizing a polarization charge generated on a surface of the substrate, wherein the formed conductive neutralization wiring pattern comprises first and second patterns which are electrically connected and formed on an upper or rear surface of the substrate in such a manner that the first and second patterns sandwich in the surface acoustic wave propagation region from both sides with respect to a direction substantially perpendicular to a guiding direction of the optical wave.

2. The fabrication method of an acousto-optic device as claimed in claim 1, further comprising:

forming a plurality of acousto-optical devices on the substrate, each acousto-optic device including a surface acoustic wave propagation region, an optical waveguide and an excitation electrode, wherein said forming a conductive neutralization wiring pattern includes forming the conductive neutralization wiring pattern individually for the plurality of acousto-optic devices in regions of the substrate other than the surface acoustic wave propagation regions of the acousto-optic devices.

3. The fabrication method of an acousto-optic device as claimed in claim 1, further comprising:

vapor depositing a conductive substance on a surface of said substrate; and diffusing the vapor deposited conductive substance into the inside of said substrate.

4. The fabrication method of an acousto-optic device as claimed in claim 3, further comprising forming a pattern of a buffer layer for preventing propagation loss of the optical wave in the excitation electrode between said substrate and the excitation electrode.

5. The fabrication method of an acousto-optic device as claimed in claim 1, further comprising forming the surface acoustic wave propagation region.

6. The fabrication method of an acousto-optic device as claimed in claim 1, further comprising grounding the formed neutralization wiring pattern.

7. The fabrication method of an acousto-optic device as claimed in claim 6, further comprising connecting the grounded neutralization wiring pattern and the formed excitation electrode to each other 8. The fabrication method of an acousto-optic device as claimed in claim 1, further comprising forming the neutralization wiring pattern on a face, different from a face of a surface of said substrate on which the surface acoustic wave propagation region is provided.

9. The fabrication method of an acousto-optic device as claimed in claim 1, further comprising forming a conductive thin film on a face, different from a face of a surface of said substrate on which the surface acoustic wave propagation region is provided.

10. A method comprising:

forming an acousto-optic device on a substrate, wherein the acousto-optic device includes an excitation electrode that excites a surface acoustic wave, a surface acoustic wave propagation region that guides the excited surface acoustic wave and an optical waveguide that guides an optical wave; and forming a conductive neutralization wiring pattern in a region of the substrate other than the surface acoustic wave propagation region so that the conductive neutralization wiring pattern neutralizes a polarization charge generated on a surface of the substrate, wherein the conductive neutralization wiring pattern comprises first and second patterns which are electrically connected and formed on an upper or rear surface of the substrate so that the first and second patterns sandwich in the surface acoustic wave propagation region with respect to a direction substantially perpendicular to a direction in which the optical wave is guided by the optical waveguide.

* * * * *

UNITED STATES PATENT AND TRADEMARK OFFICE
CERTIFICATE OF CORRECTION

PATENT NO.         : 7,430,344 B2                                         Page 1 of 1
APPLICATION NO.    : 11/723936
DATED              : September 30, 2008
INVENTOR(S)        : Hiroshi Miyata et al.

It is certified that error appears in the above-identified patent and that said Letters Patent is hereby corrected as shown below:

On the Title Page, Item (75) (Inventors), Lines 3-4, delete "Yumi Nakazawa, Zama (JP)".

Column 14, Line 6, change "acousto-optical" to --acousto-optic--.

Column 14, Line 36, after "other" insert --.--.

Signed and Sealed this

Sixteenth Day of December, 2008

JON W. DUDAS
*Director of the United States Patent and Trademark Office*